United States Patent
Yin et al.

(10) Patent No.: US 10,003,328 B1
(45) Date of Patent: Jun. 19, 2018

(54) HYBRID PULSE-WIDTH CONTROL CIRCUIT WITH PROCESS AND OFFSET CALIBRATION

(71) Applicant: QUALCOMM Incorporated, San Diego, CA (US)

(72) Inventors: Wenjing Yin, San Diego, CA (US); Xuhao Huang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days. days.

(21) Appl. No.: 15/680,120

(22) Filed: Aug. 17, 2017

(51) Int. Cl.
*H03K 3/017* (2006.01)
*H03K 7/08* (2006.01)
*H03K 5/156* (2006.01)
*H03K 5/05* (2006.01)
*H03K 5/135* (2006.01)

(52) U.S. Cl.
CPC ............ *H03K 5/156* (2013.01); *H03K 3/017* (2013.01); *H03K 5/05* (2013.01); *H03K 5/135* (2013.01); *H03K 7/08* (2013.01)

(58) Field of Classification Search
CPC ............ H03K 3/017; H03K 5/04; H03K 5/05; H03K 5/135; H03K 5/156; H03K 5/1565; H03K 7/08
See application file for complete search history.

(56) References Cited

U.S. PATENT DOCUMENTS

| | | |
|---|---|---|
| 6,930,526 B1 | 8/2005 | Silva |
| 7,126,397 B1* | 10/2006 | Mok ........................ H03K 7/08 327/175 |
| 7,332,898 B1* | 2/2008 | Harrison ............... H02M 1/084 323/268 |
| 7,692,464 B2 | 4/2010 | Murakami et al. |
| 8,860,483 B2 | 10/2014 | Wang et al. |
| 8,884,676 B2 | 11/2014 | Wong |
| 9,608,613 B2 | 3/2017 | Hargreaves et al. |
| 2007/0262801 A1* | 11/2007 | Renaud ................... H03K 7/08 327/172 |

* cited by examiner

*Primary Examiner* — Patrick O'Neill
(74) *Attorney, Agent, or Firm* — Haynes and Boone, LLP (36340)

(57) ABSTRACT

A hybrid pulse-width control circuit is provided that includes a ramp voltage generator for generating a ramp voltage signal. A clock pulse generator asserts an output clock signal responsive to the ramp voltage signal equaling a reference voltage.

20 Claims, 3 Drawing Sheets

HYBRID PULSE-WIDTH CONTROL CIRCUIT WITH PROCESS AND OFFSET CALIBRATION

TECHNICAL FIELD

This application relates to pulse-width control circuits, and more particularly to a hybrid pulse-width control circuit with process and offset calibration.

BACKGROUND

Pulse-width control circuits generate an output clock signal having a desired pulse width. For example, half-rate or double-sampling data interfaces typically include a pulse-width control circuit to adjust the duty cycle of a clock signal used to sample data for transmission or reception. Similarly, programmable-duty-cycle clock systems will also include a pulse-width control circuit. To provide the desired pulse width for a clock signal, a digital approach and also an analog approach have been used in pulse-width control circuits. In the digital approach, the architecture varies whether the output clock signal is relatively high speed or low speed but both approaches involve the use of a charge pump and loop filter in a feedback loop analogous to a phase-locked loop. For example, in the low speed digital architecture, an input clock drives a delay line through a pseudo-inverter. The delay line drives a first charge pump that in turn charges/discharges a first capacitor. A reference clock pulse drives a second charge pump that also charges (or discharges) a second capacitor. An amplifier amplifies a difference between the voltages across the two capacitors that is feedback through a loop filter to adjust the pseudo-inverter such that the output of the delay has the desired pulse width. But such a digital architecture cannot achieve an arbitrary duty cycle, has limited resolution, and consumes substantial power.

In an analog approach, the architecture for the pulse-width control circuit also tend to vary depending on the clock speed. For example, one low-speed analog approach involves the use of a digital-to-analog converter to convert a digital code into an analog voltage representing the desired pulse width. An amplifier compares the analog voltage to a feedback voltage derived from the output clock signal as filtered through a low pass filter. The amplifier controls a delay line responsive to the feedback to convert an input clock signal into the duty-cycle-adjusted output clock signal. But such analog approaches also consume substantial power and have difficulty providing an arbitrary pulse width due to process, voltage, and temperature variations.

Accordingly, there is a need in the art for an improved adjustable pulse-width control circuit that is low power and calibrated against process variations and circuit non-linearities.

SUMMARY

A hybrid pulse-width control circuit is provided that includes a ramp voltage generator for generating a ramp voltage signal. A comparator compares the ramp voltage signal to a reference voltage to generate a comparator output signal. A clock pulse generator is configured to assert an output clock signal responsive to an assertion of the comparator output signal. The clock pulse generator also includes a counter that counts an on-time count responsive to a reference clock signal while the output clock signal is asserted. When the on-time count equals a desired on-time count, the clock pulse generator resets (de-asserts) the output clock signal and the ramp voltage signal.

During a calibration phase such as at startup of the hybrid pulse-width control circuit, a calibration circuit adjusts a value of a resistance and/or a capacitance in the ramp voltage generator. In particular, the calibration circuit counts an off-time count responsive to the reference clock signal while the output clock signal is reset. Should the off-time count at the end of the off-time period for the output clock signal not equal a desired off-time count, the calibration circuit adjusts the resistance and/or the capacitance in the ramp voltage generator until the off-time count equals the desired off-time count. In this fashion, process variations and circuit offsets are advantageously calibrated out from the resulting duty cycle for the output clock signal, which equals a ratio of the desired on-time count to a sum of the desired on-time count and the desired off-time count. Moreover, an oscillator producing the reference signal is only enabled during the calibration period and during the on-times for the output clock signal such that the accurate control of the duty cycle is also low power, particularly as the duty cycle is reduced.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A pulse-width control circuit is provided that provides an arbitrary pulse width yet is low power and calibrated against process variations and circuit offsets. Since the pulse width control circuit uses both digital and analog elements it is denoted herein as a hybrid pulse width control circuit. In this hybrid architecture, a ramp voltage generator uses a resistor capacitor (RC) circuit to generate a ramp voltage signal. A comparator compares the ramp voltage signal to a reference voltage such that the comparator asserts its output signal when the ramp voltage signal rises from ground to equal the reference voltage. A clock pulse generator and counter asserts an output clock signal in response to the assertion of the comparator output signal. In addition, the clock pulse generator and counter begins to count responsive to oscillations of an oscillator signal. After counting a desired number (Dn) of oscillations, the clock pulse generator and counter resets the output clock signal and also resets the ramp voltage signal. The ramp voltage generator and the comparator thus form the analog portion of the resulting hybrid pulse-width control loop whereas the clock pulse generator and counter form the digital portion.

The RC circuit in the ramp voltage generator is prone to process, temperature, and voltage variations (these variations being referred to herein as process variations for brevity). Similarly, an amplifier within the ramp voltage generator as well as the comparator will deviate from ideal behavior due to offset effects. For example, the comparator may not be triggered when the ramp voltage signal equals the reference voltage but instead is triggered when the ramp voltage signal equals the reference voltage+/−some offset voltage. The hybrid pulse-width control circuit thus includes a duty-cycle calibration circuit that functions to calibrate the RC circuit in the ramp voltage generator so as to obviate the errors resulting from process and offset variations. In particular, as will be explained further herein, the off time for the output clock signal is a function of a product of the resistance (R) and the capacitance (C) for the RC circuit within the ramp voltage generator. The duty-cycle calibration circuit counts the oscillations from the oscillator during the off time for the output clock cycle and compares them a desired number (Dm) of oscillations. Should the counted oscillations not equal the desired number Dm, the duty-cycle calibration circuit adjusts the resistance R and/or the capacitance C for the RC circuit until the counted oscillations equal Dm. The resulting pulse width for the output clock signal thus equals the ratio Dn/(Dn+Dm) such that the pulse width is arbitrary and readily tuned to a desired value merely by adjusting Dn and/or Dm.

Figure 1:
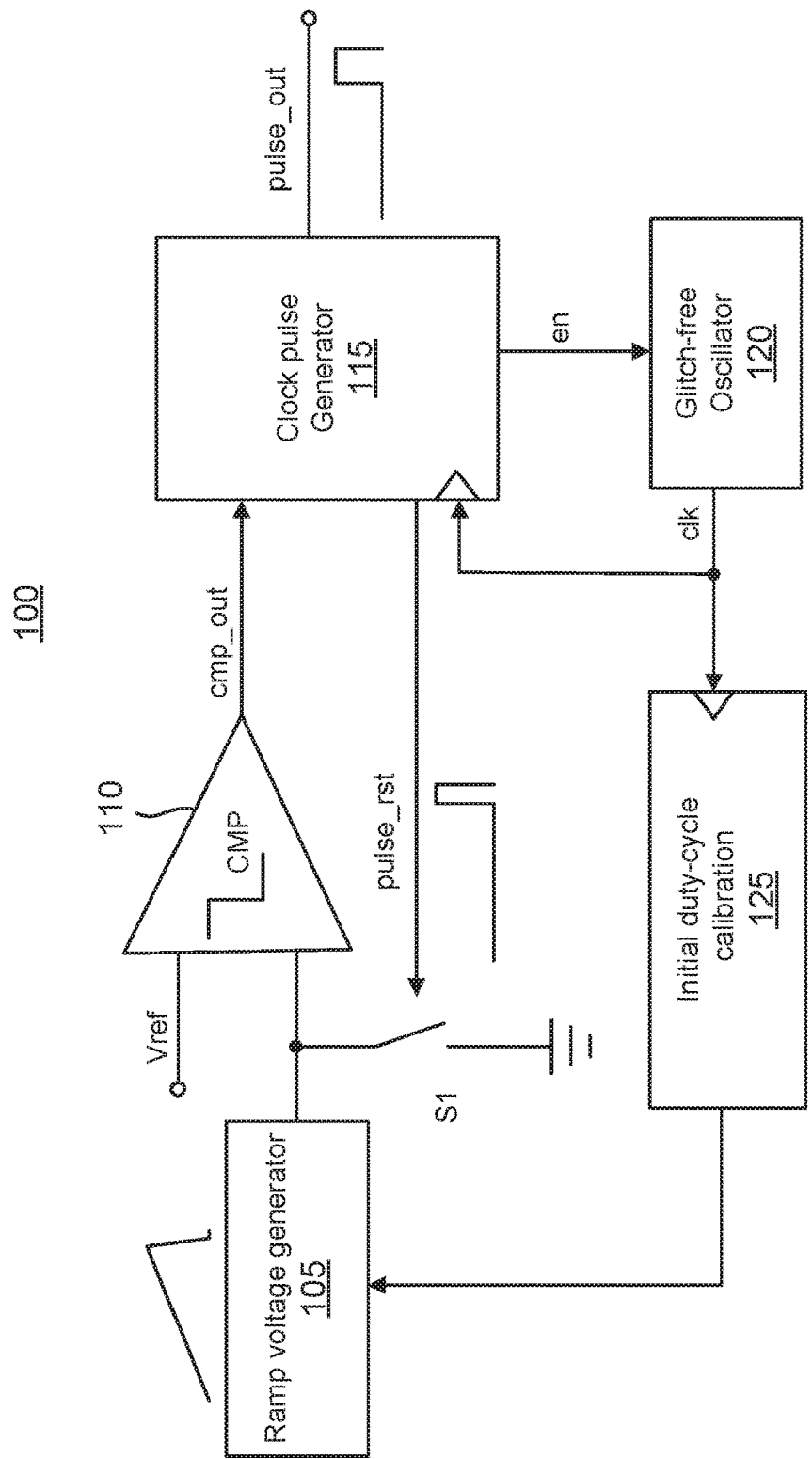
FIG. 1 is a block diagram of a hybrid pulse-width control circuit in accordance with an aspect of the disclosure.

An example pulse-width control circuit is shown in FIG. 1. A ramp voltage generator 105 generates a ramp voltage signal that a comparator 110 compares to a reference voltage (Vref). Comparator 110 will thus trigger a comparator output signal (cmp_out) when the ramp voltage signal equals the reference voltage. This triggering may be either logic-high or logic-low. The following discussion will be directed to an embodiment in which the comparator output signal is triggered high (charged to a power supply voltage) when the ramp voltage signal equals the reference voltage but it will be appreciated that the comparator output signal may be triggered low (discharged to ground) in alternative embodiments.

A clock pulse generator and counter 115 asserts an output clock signal (pulse_out) high in response to the assertion of the comparator output signal. In addition, the assertion of the comparator output signal triggers a glitch-free oscillator to begin cycling a reference clock signal (clk). Clock pulse generator and counter 115 counts responsive to edges in the reference clock signal and resets the output clock signal when the count reaches the desired value Dn. In addition, clock pulse generator and counter 115 asserts a pulse reset signal (pulse_rst) when the count equals Dn. The assertion of the pulse reset signal closes a switch S1 that discharges the ramp voltage signal to ground accordingly. To calibrate the process and offset variations, a duty-cycle calibration circuit 125 adjusts an RC circuit (discussed further below) in ramp voltage generator 105 so that an off-time count responsive to the reference clock while the output clock signal is low equals the desired value Dm.

Figure 2:
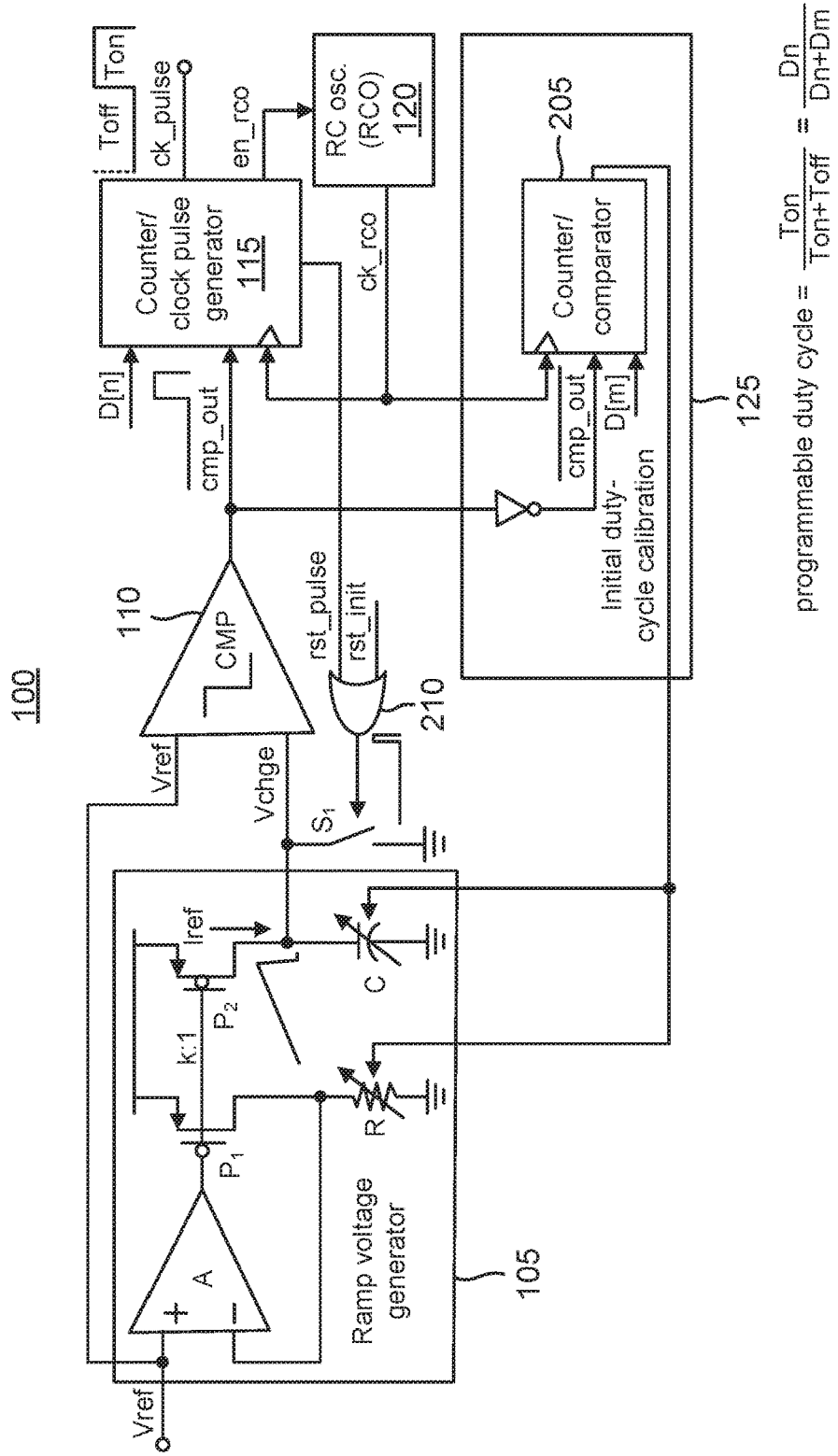
FIG. 2 is a more detailed circuit diagram of the hybrid pulse-width control circuit of FIG. 1.

The adjustment of the RC circuit may be better understood with reference to FIG. 2. Ramp voltage generator 105 includes a differential amplifier 200 that charges a gate of a PMOS transistor P1 with a control voltage. Transistor P1 has its source tied to a power supply node for a power supply voltage and its drain tied to a variable resistor R. The drain of transistor P1 also feeds back to the negative input of differential amplifier 200. Since the positive input of differential amplifier 200 receives the reference voltage, the drain voltage of transistor P1 will be controlled to equal the reference voltage. The current through variable resistor R will thus equal a ratio of the reference voltage to R, where R is also the resistance of variable resistor R. Differential amplifier 200 also drives the gate of a PMOS transistor P2 with the control voltage. Transistor P2 has its source tied to the power supply voltage node and its drain coupled to ground through a variable capacitor C. The channel in transistor P1 is k times bigger than the channel for transistor P2, where k is an arbitrary scaling factor. A reference current (Iref) conducted by transistor P2 thus equals a ratio of Vref/(k*R). Since the ramp voltage signal is reset by switch S1 at the end of the off time (the portion of the period during which the output clock signal is not asserted), a product of the reference voltage and a capacitance C (C also representing the capacitance for variable capacitor C) equals a product of Iref and Toff, where Toff is the off time for the output clock signal. Toff thus equals k*R*C. The resistance R and the capacitance C may thus be calibrated to set the off time for the output clock signal as desired.

The assertion of the comparator output signal (cmp_out) triggers clock pulse generator and counter 115 to assert the output clock signal (ck_pulse) and to assert an enable signal (en_rco) for glitch-free oscillator 120. In response to the assertion of the enable signal, glitch-free oscillator 120 begins to cycle a reference clock signal (ck_rco). The frequency of the reference clock signal is markedly higher than the frequency of the output clock signal so that the reference clock signal will cycle multiple times during the on time (Ton) for the output clock signal during which the clock output signal is pulsed high to the power supply voltage. Clock pulse generator and counter 115 counts an on-time count responsive to the oscillations of the reference clock while the output clock signal is high. For example, clock pulse generator and counter 115 may count responsive to rising edges of the reference clock signal. Alternatively, the count may be responsive to falling edges or to both types of edges. Clock pulse generator and counter 115 is programmed with a desired on-time count Dn. Once the on-time count equals the desired on-time count, clock pulse generator and counter 115 resets the output clock signal and also asserts the reset signal (rst_pulse) for closing the switch S1. The reset signal may be ORed in an OR gate 210 with an initial reset signal (rst_init) so that the switch S1 may be closed in response to a start-up or other desired condition.

Duty-cycle calibration circuit 125 includes a counter and comparator 205 that is triggered at startup during a calibration period to calibrate the R and C values in ramp voltage generator 105. Duty-cycle calibration circuit 125 may thus be designated as an initial duty-cycle calibration circuit. At startup, the comparator output signal cmp_out is low such that an inverter 215 inverts the comparator output signal into a complement version (cmp_out bar) to trigger counter and comparator 205 to begin counting an off-time clock. In contrast to clock pulse generator and counter 115, counter and comparator 205 thus counts responsive to the reference clock while the comparator output signal is low (the off time Toff for the output clock signal). Counter and comparator 205 is programmed with a desired off-time count Dm. Should the off-time count be less than Dm (or greater than Dm), duty-cycle calibration circuit adjusts the resistance R and/or the capacitance C in ramp voltage generator 105 so that the off-time count equals the desired off-time count. The resulting duty cycle for the output clock signal thus equals the ratio Dn/(Dn+Dm), The calibration by duty-cycle calibration circuit 125 not only adjusts for any process variation in the R and C values but also accounts for any offset in differential amplifier 200 and comparator 110. In addition, note that the resulting operation is advantageously low power since oscillator 120 only cycles during the on time when the output clock signal is pulsed high. Since the duty cycle is arbitrary, it can be accurately reduced to very low values such as two percent. The resulting power consumption at such low duty cycles is reduced accordingly. Note that a calibration period in which duty-cycle calibration circuit 125 is active may be periodically repeated to account for any temperature or voltage variations during operation of hybrid pulse-width control circuit 100. In one embodiment, duty-cycle calibration circuit 125 may be deemed to form a means for counting an off-time clock during a calibration period in which the output clock signal is de-asserted to provide an off-time count and for adjusting a capacitance for the variable capacitor C o force the off-time count to equal a desired off-time count.

Figure 3:
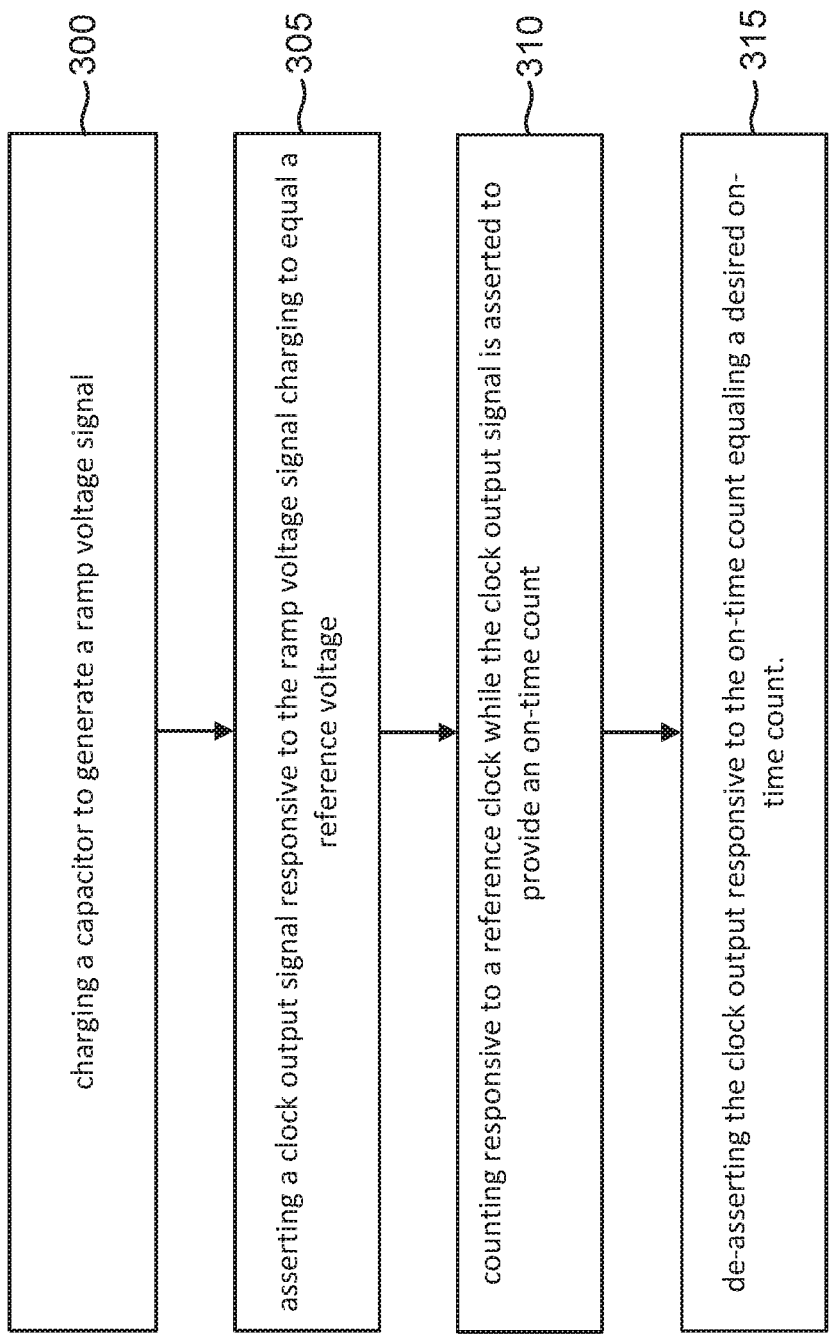
FIG. 3 is a flowchart for an example method of operation of a hybrid pulse-width control circuit in accordance with an aspect of the disclosure.

An example method of operation for a hybrid pulse-width control circuit will now be discussed with reference to the flowchart shown in FIG. 3. The method includes an act 300 of charging a capacitor to generate a ramp voltage signal. The charging of variable capacitor C is an example of act 300. In addition, the method includes an act 305 of asserting an output clock signal responsive to the ramp voltage signal equaling a reference voltage. The assertion of the output clock signal by clock pulse generator and counter 115 in response to comparator 110 asserting the comparator output signal because the voltage ramp signal equals the reference voltage is an example of act 305. The method also includes an act 310 of counting responsive to a reference clock signal while the output clock signal is asserted to provide an on-time count. The counting by clock pulse generator and counter 115 is an example of act 810. Finally, the method includes an act 815 of de-asserting the output clock signal responsive to the on-time count equaling a desired on-time count. The resetting of the output clock signal by clock pulse generator and counter 115 is an example of act 315.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A pulse-width control circuit, comprising:
   a ramp voltage generator configured to charge a capacitor to generate a ramp voltage signal;
   a clock pulse generator and counter configured to assert an output clock signal responsive to the ramp voltage signal equaling a reference voltage; and
   an oscillator configured to cycle a reference clock signal while the output clock signal is asserted, wherein the clock pulse generator and counter is further configured to count responsive to the cycling of the reference clock signal to provide an on-time count, and wherein the clock pulse generator and counter is further configured to reset the output clock signal responsive to the on-time count equaling a desired on-time count for the output clock signal.

2. The pulse-width control circuit of claim 1, further comprising:
   a switch coupled between ground and a terminal for the capacitor, wherein the clock pulse generator and counter is further configured to close the switch to reset the ramp voltage signal responsive to the on-time count equaling the desired on-time count for the output clock signal.

3. The pulse-width control circuit of claim 1, further comprising
   a comparator configured to assert a comparator output signal responsive to the ramp voltage signal equaling the reference voltage, wherein the clock pulse generator and counter is configured to assert the output clock signal responsive to the assertion of the comparator output signal.

4. The pulse-width control circuit of claim 1, wherein the ramp voltage generator includes a differential amplifier configured to drive a gate of a first transistor with a control voltage to generate a reference current for the charging of the capacitor.

5. The pulse-width control circuit of claim 4, wherein the differential amplifier is further configured to drive a gate of a second transistor with the control voltage, wherein the second transistor has a terminal connected to ground through a resistor, and wherein the differential amplifier includes a negative feedback loop to charge the terminal of the second transistor to the reference voltage.

6. The pulse-width control circuit of claim 5, wherein the first transistor is a first PMOS transistor and the second transistor is a second PMOS transistor.

7. The pulse-width control circuit of claim 6, wherein a source for the first PMOS transistor and a source for the second PMOS transistor are both connected to a power supply node.

8. The pulse-width control circuit of claim 5, wherein the second transistor is bigger than the first transistor.

9. The pulse-width control circuit of claim 5, wherein the resistor is a variable resistor and the capacitor is a variable capacitor, the pulse-width control circuit further comprising:
   a duty-cycle calibration circuit configured to enable the oscillator during a calibration period, wherein the duty-cycle calibration circuit is further configured to count an off-time count responsive to the reference clock signal to provide an off-time count, and wherein the duty-cycle calibration circuit is further configured to adjust a resistance of the variable resistor and a capacitance of the variable capacitor to force the off-time count to equal a desired off-time count for the output clock signal.

10. The pulse-width control circuit of claim 9, wherein a duty cycle for the output clock signal equals a ratio of the desired on-time count to a sum of the desired on-time count and the desired off-time count.

11. A method, comprising;
    charging a capacitor to generate a ramp voltage signal;
    asserting an output clock signal responsive to the ramp voltage signal equaling a reference voltage;
    counting responsive to a reference clock while the output clock signal is asserted to provide an on-time count;
    de-asserting the output clock signal responsive to the on-time count equaling a desired on-time count.

12. The method of claim 11, further comprising:
    resetting the ramp voltage signal responsive to the on-time count equaling the desired on-time count.

13. The method of claim 11, wherein resetting the ramp voltage signal comprises discharging the capacitor to ground through a switch.

14. The method of claim 11, further comprising:
    while the output clock signal is de-asserted, charging a gate of a first transistor having a terminal coupled to ground through a resistor with a control voltage to charge the terminal to the reference voltage;

charging a gate of a second transistor with the control voltage to generate a reference current to charge the capacitor to generate the ramp voltage signal.

15. The method of claim 14, further comprising:
adjusting a resistance of the resistor and a capacitance of the capacitor to calibrate an off-time for the output clock signal to a desired value.

16. The method of claim 15, wherein adjusting the resistance and the capacitance comprises:
counting responsive to the reference clock while the output clock signal is de-asserted to generate an off-time count; and
adjusting the resistance and the capacitance until the off-time count equals a desired off-time count.

17. A pulse-width control circuit, comprising:
a ramp voltage generator configured to charge a variable capacitor to generate a ramp voltage signal;
a clock pulse generator and counter configured to assert an output clock signal responsive to the ramp voltage signal equaling a reference voltage, wherein the clock pulse generator and counter is further configured to count responsive to the cycling of a reference clock signal to provide an on-time count, and wherein the clock pulse generator and counter is further configured to reset the output clock signal responsive to the on-time count equaling a desired on-time count for the output clock signal; and
means for counting an off-time clock during a calibration period in which the output clock signal is de-asserted to provide an off-time count and for adjusting a capacitance for the variable capacitor to force the off-time count to equal a desired off-time count.

18. The pulse-width control circuit of claim 17, further comprising:
an oscillator for producing the reference clock, wherein the oscillator is configured to be active only during the calibration period and during the assertion of the output clock period.

19. The pulse-width control circuit of claim 17, wherein the ramp voltage generator is further configured to produce a first current that equals a ratio of the reference voltage and a resistance for a variable resistor and to produce a reference current for charging the variable capacitor, wherein the reference current is a fraction of the first current.

20. The pulse-width control circuit of claim 19, wherein the means is further configured to adjust the resistance for the variable resistor to force the off-time count to equal the desired off-time count.

* * * * *